(12) United States Patent  
Wang

(10) Patent No.: US 7,185,307 B2  
(45) Date of Patent: Feb. 27, 2007

(54) METHOD OF FABRICATING AND INTEGRATED CIRCUIT THROUGH UTILIZING METAL LAYERS TO PROGRAM RANDOMLY POSITIONED BASIC UNITS

(75) Inventor: Hsin-Shih Wang, Fremont, CA (US)

(73) Assignee: Faraday Technology Corp., Hsin-Chu (TW)

( * ) Notice: Subject to any disclaimer, the term of this patent is extended or adjusted under 35 U.S.C. 154(b) by 390 days.

(21) Appl. No.: 10/708,256

(22) Filed: Feb. 19, 2004

(65) Prior Publication Data

US 2005/0186714 A1    Aug. 25, 2005

(51) Int. Cl.  
*G06F 17/50* (2006.01)

(52) U.S. Cl. ............................................ 716/17; 716/1

(58) Field of Classification Search .................... 716/1, 716/8, 11, 16–17; 438/128–129; 257/691  
See application file for complete search history.

(56) References Cited

U.S. PATENT DOCUMENTS

| 6,445,065 B1 * | 9/2002 | Gheewala et al. ......... 257/691 |
| 6,902,957 B2 * | 6/2005 | Wang et al. ............... 438/128 |
| 2003/0140080 A1 * | 7/2003 | Friend et al. .............. 708/700 |

* cited by examiner

*Primary Examiner*—Vuthe Siek  
(74) *Attorney, Agent, or Firm*—Winston Hsu

(57) ABSTRACT

A method of fabricating an integrated circuit. The integrated circuit has a semiconductor body. The method includes forming a plurality of basic units with the same component characteristic on the semiconductor body, and forming at least a layout layer to program the basic units for building a clocked logic circuit and a non-clocked logic circuit without placing restrictions on positions of the clocked logic circuit and the non-clocked logic circuit on the semiconductor body.

17 Claims, 13 Drawing Sheets

METHOD OF FABRICATING AND INTEGRATED CIRCUIT THROUGH UTILIZING METAL LAYERS TO PROGRAM RANDOMLY POSITIONED BASIC UNITS

BACKGROUND OF INVENTION

1. Field of the Invention

The present invention relates to a method of fabricating a metal programmable integrated circuit, and more specifically, to a method of fabricating an integrated circuit through utilizing metal layers to program randomly positioned basic units.

2. Description of the Prior Art

FIG. 1 is a diagram showing a prior art semiconductor body 10 of an integrated circuit. The semiconductor body has a plurality of functional circuit cells 12. The functional circuit cells 12 are arranged row-by-row or column-by-column according to an array format to finally form a matrix format. It is well-known that the matrix format corresponds to a minimum chip size. That is, the allocation of the functional circuit cells 12 corresponds to a maximum component density.

The semiconductor body 10 is divided into synchronous regions 14a, 14b and a non-synchronous region 16. All of the functional circuit cells 18a, 18b within the synchronous regions 14a, 14b operate according to a clock signal. For example, each of the functional circuit cells 18a, 18b respectively functions as a flip-flop, a latch, or a clock buffer after being defined by a corresponding routing design. On the other hand, the functional circuit cells 20 within the non-synchronous region 16 are not driven by clock signals.

Each functional circuit cell 20 is capable of performing a predetermined logic operation after being defined by a corresponding routing design. For example, each of the functional circuit cells 20 respectively functions as an AND logic gate circuit, an OR logic gate circuit, or an XOR logic gate circuit. After the integrated circuit designer hands over the designed photomask patterns to the maker of the semiconductor body 10, upper metal layers are then formed on the semiconductor body 10 based on the photomask patterns.

Please refer to FIG. 1 in conjunction with FIG. 2. FIG. 2 is a diagram showing traces routed within the synchronous regions 14a, 14b. In the synchronous region 14a, a clock trace 22a vertically crosses each functional circuit cell 18a of the synchronous region 14a. In addition, two power traces 24a, 26a also cross each functional circuit cell 18a of the synchronous region 14a. The power traces 24a, 26a are respectively used to provide operating voltages (a high voltage level Vdd and a low voltage level Vss for example) required by each functional circuit cell 18a. Similarly, a clock trace 22b and two power traces 24b, 26b vertically cross each functional circuit cell 18b of the synchronous region 14b. As shown in FIG. 2, power traces 24a, 24b, 26a, 26b are respectively located at both sides of the clock traces 22a, 22b so that noise transmitted by the clock traces 22a, 22b interfering with the clock signals is reduced. In other words, clock skew related to the clock signal is lessened.

As mentioned above, the semiconductor body 10 of the prior art integrated circuit is divided into synchronous regions 14a, 14b and a non-synchronous region 16. The functional circuit cells 18a, 18b, driven by the clock signals, are distributed in the synchronous regions 14a, 14b. That is, the prior art has to consider clock balance for controlling clock skew according to the geometric distribution of the synchronous regions 14a, 14b within the semiconductor body 10. However, based on the prior art, the semiconductor body 10 is required to define the synchronous regions 14a, 14b and the non-synchronous region 16. Therefore, when programming the semiconductor body 10 to perform a predetermined logic operation, the IC designer needs to consider the allocation of the synchronous regions 14a, 14b and the non-synchronous region 16 on the semiconductor body 10. It is obvious that the allocation of the synchronous regions 14a, 14b and the non-synchronous region 16 on the prior art semi-conductor body 10 is fixed. Therefore, it is impossible to elastically program traces routed among the transistors within the synchronous regions 14a, 14b and the non-synchronous region 16 for implementing another predetermined logic operation mentioned above.

Because the synchronous regions 14a, 14b and the non-synchronous region 16 on the semiconductor body 10 are defined according to a predetermined ratio, say, the ratio of transistors within the synchronous regions 14a, 14b to the transistors within the non-synchronous region 16, for respectively establishing the clocked logic circuits and the non-clocked logic circuits, the application field of the semiconductor body 10 is limited by the fixed allocation of the synchronous regions 14a, 14b and the non-synchronous region 16. That is, the application elasticity of the prior art semiconductor body 10 is bad.

SUMMARY OF INVENTION

It is therefore a primary objective of the claimed invention to provide a method of programming basic units randomly positioned on a semiconductor body for forming either a clocked logic circuit or a non-clocked logic circuit according to different requirements.

Briefly summarized, a preferred embodiment discloses a method of fabricating an integrated circuit. The integrated circuit has a semiconductor body. The claimed method includes forming a plurality of basic units on the semiconductor body, each of the basic units having an identical device characteristic, and forming at least a layout layer to program the basic units for generating a clocked logic circuit and a non-clocked logic circuit without placing restrictions on positions of the clocked logic circuit and the non-clocked logic circuit on the semiconductor body.

According to the preferred embodiment, another claimed method of fabricating the integrated circuit includes forming a plurality of basic units on the semiconductor body, each of the basic units having a plurality of first transistors cascaded in a series and a plurality of second transistors cascaded in a series, and forming at least a layout layer to program traces among the first transistors and the second transistors of at least a basic unit for controlling the basic unit to form either a clocked logic circuit or a non-clocked logic circuit.

The preferred embodiment discloses an integrated circuit, and the claimed integrated circuit includes a semiconductor body for positioning a plurality of basic unit, each of the basic units having an identical device characteristic; a clocked logic circuit formed on the semiconductor body, the clocked logic circuit being formed by at least a basic unit; and a non-clocked logic circuit formed on the semiconductor body, the non-clocked logic circuit being formed by at least a basic unit. The semiconductor body does not limit locations of the clocked logic circuit and the non-clocked logic circuit formed on the semiconductor body.

According to the preferred embodiment, another claimed integrated circuit includes a semiconductor body for positioning a plurality of basic units, each of the basic units having a plurality of first transistors cascaded in a series and a plurality of second transistors cascaded in a series, a clocked logic circuit formed on the semiconductor body, and a non-clocked logic circuit formed on the semiconductor. The clocked logic circuit is formed by at least a basic unit, and the non-clocked logic circuit is formed by at least a basic unit.

The claimed method forms a plurality of basic units on a semiconductor body, wherein the allocation of basic units on the semiconductor body is not divided into a synchronous region and a non-synchronous region. Then, the method according to the present invention dynamically determines how many basic units are required to form clocked logic circuits and how many basic units are needed to form non-clocked logic circuits according to functionality of different integrated circuits. Therefore, the same semiconductor bodies are easily programmed by metal layers to produce different integrated circuits.

These and other objectives of the claimed invention will no doubt become obvious to those of ordinary skill in the art at reading the following detailed description of the preferred embodiments that are illustrated in the various figures and drawings.

DETAILED DESCRIPTION

Figure 1:
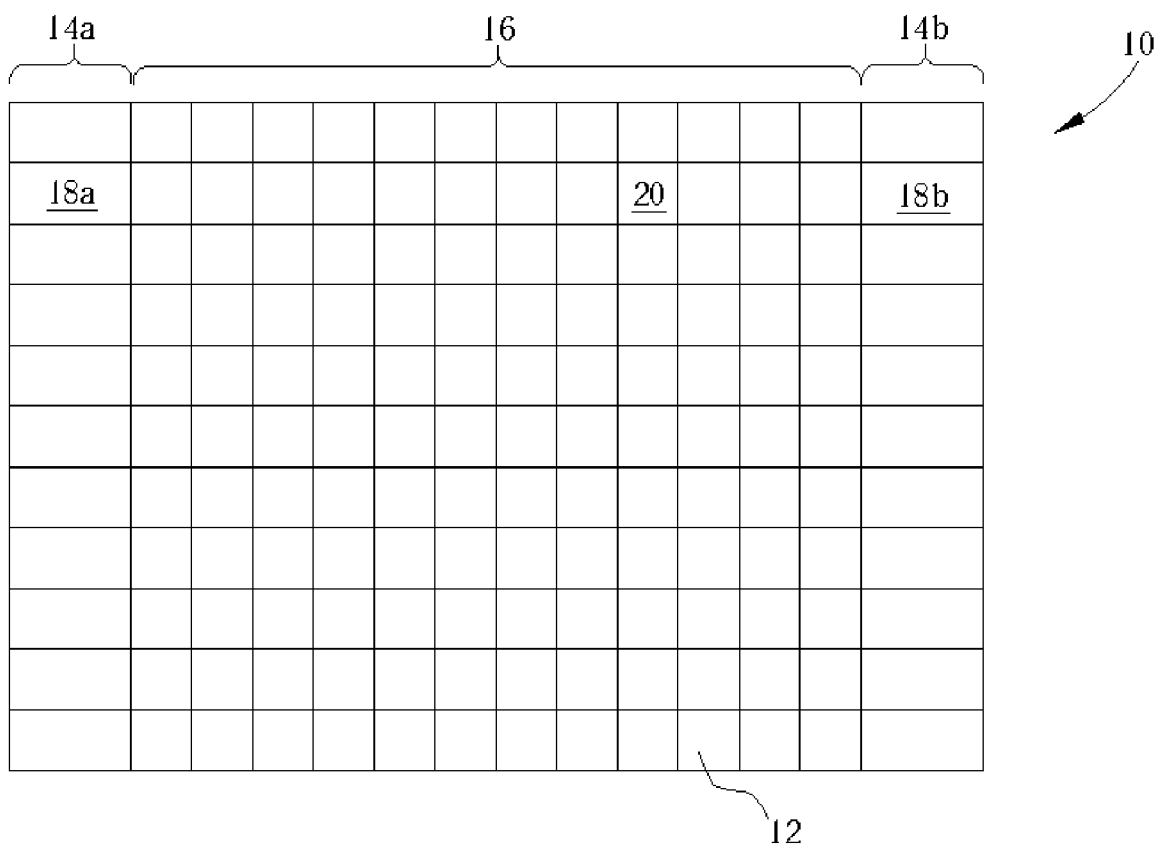
FIG. 1 is a diagram showing a prior art semiconductor body of an integrated circuit.
Figure 2:
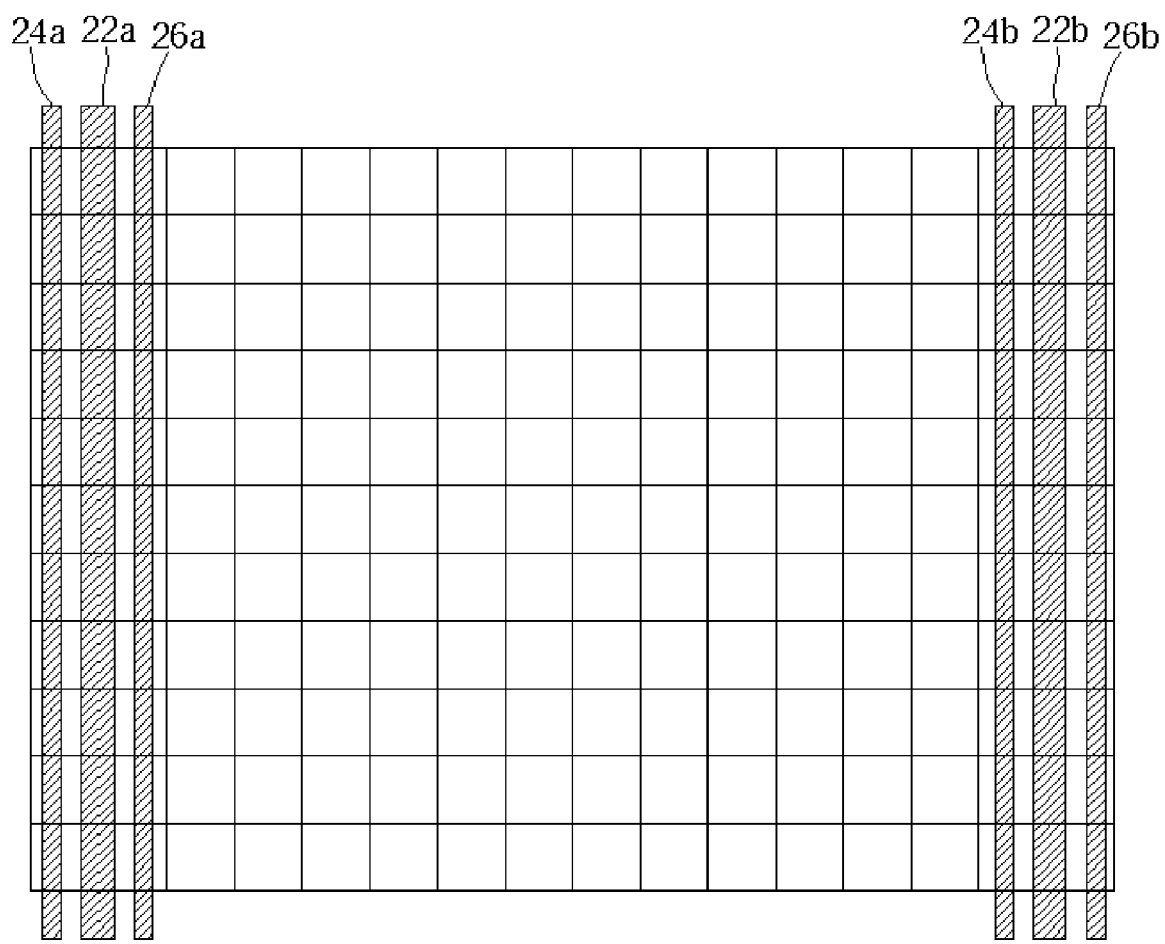
FIG. 2 is a diagram showing traces routed within the synchronous regions.
Figure 3:
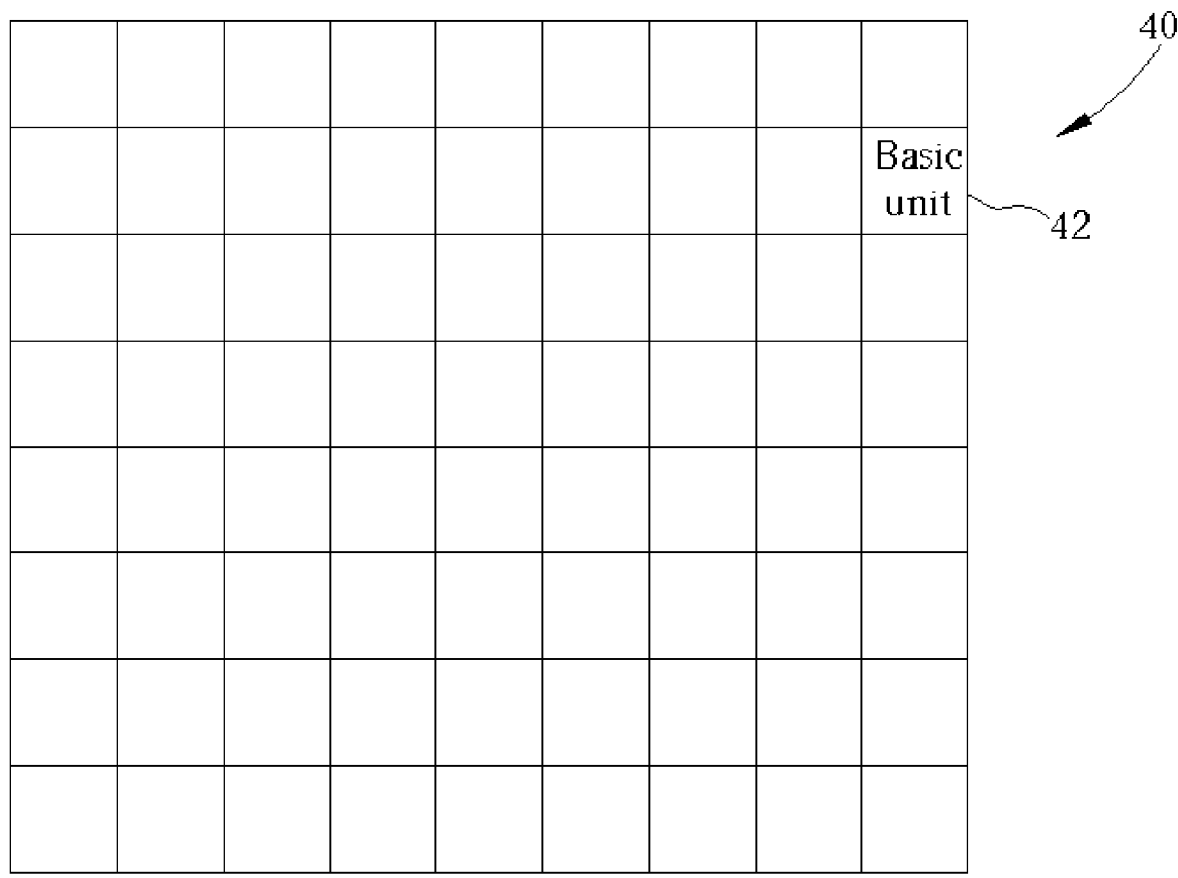
FIG. 3 is a diagram showing a semiconductor body according to the present invention.

Please refer to FIG. 3, which is a diagram showing a semiconductor body 40 according to the present invention. The semiconductor body 40 has a plurality of basic units 42. In the preferred embodiment, the basic units 42 are positioned on the semiconductor body 40 according to a matrix format for acquiring greater density. In other words, the area required to accommodate the basic units 42 is reduced to further shrink size of the corresponding integrated circuit. It is well-known that a semiconductor foundry fabricates the semiconductor body 40 in advance. An integrated circuit designer is then capable of designing photomask patterns for traces routed among the basic units 42. In the end, according to the photomask patterns designed by the integrated circuit designer, the semiconductor foundry forms at least a metal layer upon the semiconductor body 40 to position conductive wires routed among the basic units 42. Therefore, a single basic unit 42 or a group of basic units 42 can be programmed to make the integrated circuit capable of performing a predetermined logic operation according to the design defined by the IC designer.

Figure 4:
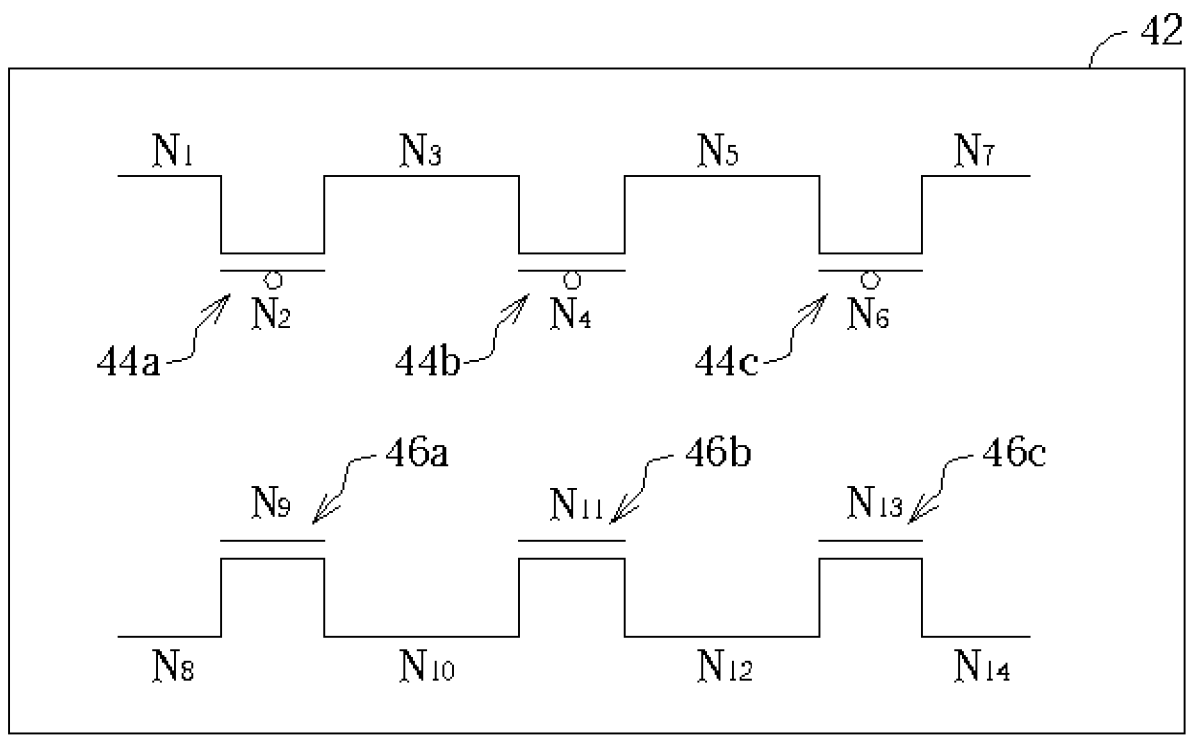
FIG. 4 is a diagram of a basic unit shown in FIG. 3.

Please refer to FIG. 4, which is a diagram of the basic unit 42 shown in FIG. 3. In the preferred embodiment, six transistors 44a, 44b, 44c, 46a, 46b, 46c are positioned within the basic unit 42, wherein transistors 44a, 44b, 44c are PMOS transistors, and transistors 46a, 46b, 46c are NMOS transistors. In addition, transistors 44a, 44b, 44c are cascaded in a series, and transistors 46a, 46b, 46b are cascaded in a series as well. As shown in FIG. 3, a plurality of basic units 42 are allocated on the semiconductor body 40. It is obvious from FIG. 4 that one basic unit 42 only contains transistors 44a, 44b, 44c, 46a, 46b, 46c. The allocation of basic units 42 is not divided into a synchronous region and a non-synchronous region as the prior art does. In other words, the randomly positioned basic units 42 according to the present invention are programmed to establish either a clocked logic circuit or a non-clocked logic circuit through metal layers. Therefore, when the basic units 42 are programmed, they are not divided into two groups (a synchronous region and a non-synchronous region for example) according to their locations. That is, no restriction is placed on positions of the clocked logic circuit and the non-clocked logic circuit on the semiconductor body when the basic units 42 are programmed to form the clocked logic circuit and the non-clocked logic circuit. Concerning the clocked logic circuit, it can be a flip-flop or a latch. With regard to the non-clocked logic circuit, it can function as a specific logic gate or a look-up table.

Figure 5:
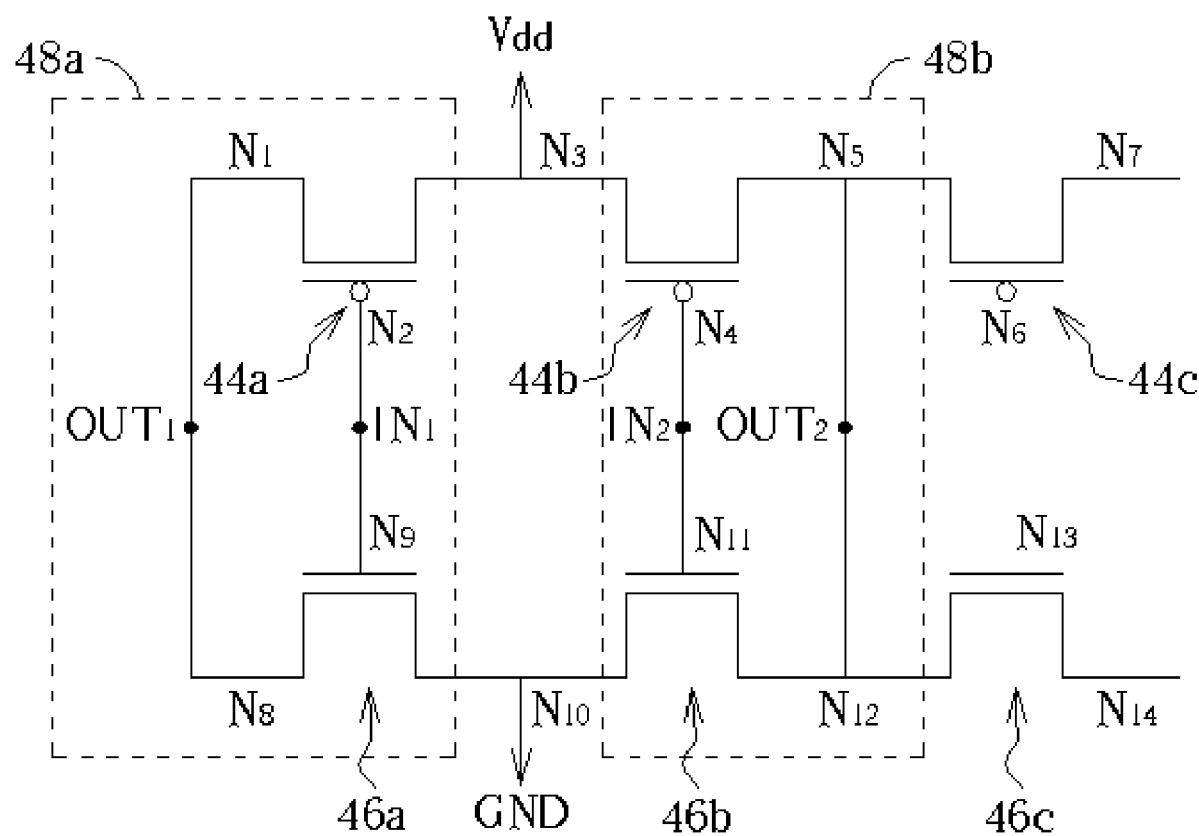
FIG. 5 is a diagram illustrating inverters established by the basic unit according to the present invention.
Figure 6:
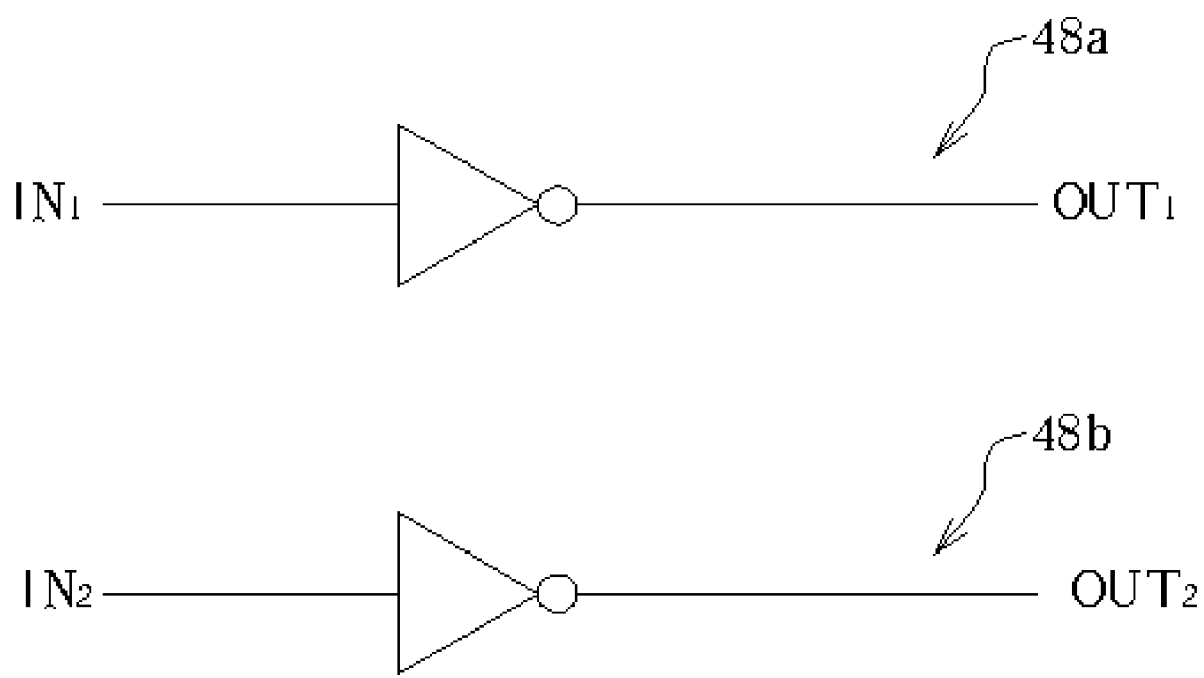
FIG. 6 is an equivalent circuit diagram of the inverters shown in FIG. 5.

In the preferred embodiment, gates, sources, and drains of the transistors 44a, 44b, 44c correspond to a plurality of programming nodes $N_1$, $N_2$, $N_3$, $N_4$, $N_5$, $N_6$, $N_7$. In addition, gates, sources, and drains of the transistors 46a, 46b, 46c also correspond to a plurality of programming nodes $N_8$, $N_9$, $N_{10}$, $N_{11}$, $N_{12}$, $N_{13}$, $N_{14}$. Therefore, the logic operation run by the basic unit 42 is programmed and defined through the programming nodes $N_1$–$N_{14}$. Please refer to FIG. 5 in conjunction with FIG. 6. FIG. 5 is a diagram illustrating inverters 48a, 48b established by the basic unit 42 according to the present invention, and FIG. 6 is an equivalent circuit diagram of the inverters 48a, 48b shown in FIG. 5.

For the inverters 48a, 48b shown in FIG. 5, the programming node $N_1$ is electrically connected to the programming node $N_8$, the programming node $N_2$ is electrically connected to the programming node $N_9$, the programming node $N_4$ is electrically connected to the programming node $N_{11}$, the programming node $N_5$ is electrically connected to the programming node $N_{12}$, the programming node $N_3$ is electrically connected to a high voltage level ($V_{dd}$ for example), and the programming node $N_{10}$ is electrically connected to a low voltage level (GND for example) through routing traces provided by at least a metal layer. In addition, programming nodes $N_1$, $N_8$ correspond to an output port $OUT_1$, programming nodes $N_2$, $N_9$ correspond to an input port $IN_1$, programming nodes $N_4$, $N_{11}$ correspond to an input port $IN_2$, and programming nodes $N_5$, $N_{12}$ correspond to an output port $OUT_2$.

Concerning the inverter 48a, the transistor 46a within the inverter 48a is turned on, and the transistor 44a is turned off when the input port $IN_1$ is driven by a high voltage level ($V_{dd}$ for example). In other words, the voltage level of the output port $OUT_1$ approaches a low voltage level (GND for example). On the contrary, the transistor 44a within the inverter 48a is turned on, and the transistor 46a is turned off when the input port $IN_1$ is driven by a low voltage level (GND for example). That is, the voltage level of the output port $OUT_1$ approaches a high voltage level ($V_{dd}$ for example). Therefore, an equivalent circuit representing the inverter 48a is shown in FIG. 6.

For the inverter 48b, it has functionality identical to that of the inverter 48a. When the input port $IN_2$ is driven by a high voltage level ($V_{dd}$ for example), the transistor 46b within the inverter 48b is turned on, and the transistor 44b remains off. In other words, the voltage level of the output port $OUT_2$ approaches a low voltage level (GND for example). On the contrary, the transistor 44b within the inverter 48b is turned on, and the transistor 46b remains off when the input port $IN_2$ is driven by a low voltage level (GND for example). Therefore, the voltage level of the output port $OUT_2$ approaches a high voltage level ($V_{dd}$ for example). Similarly, an equivalent circuit representing the inverter 48a is shown in FIG. 6. From the above description, the basic units 42 according to the present invention are capable of establishing any non-clocked logic circuits on the semiconductor body 42 with the help of the routing traces programmed by metal layers.

Figure 7:
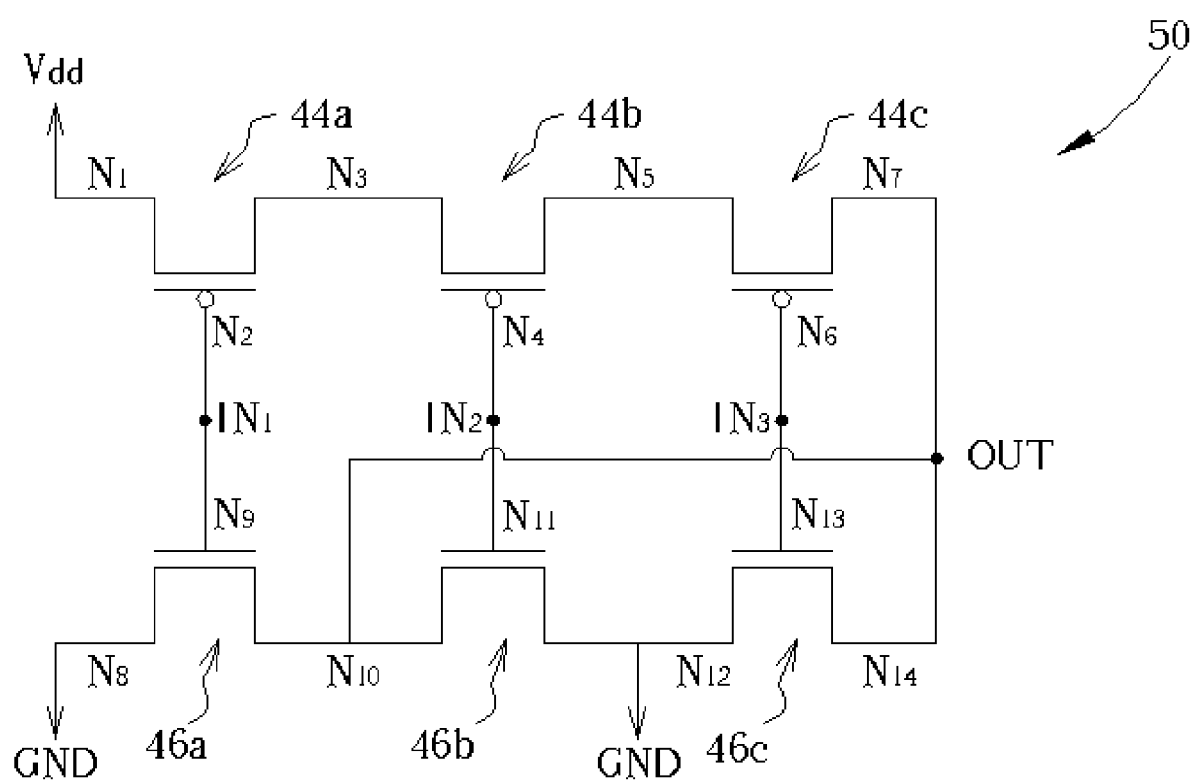
FIG. 7 is a diagram illustrating an NOR gate established by the basic unit according to the present invention.
Figure 8:
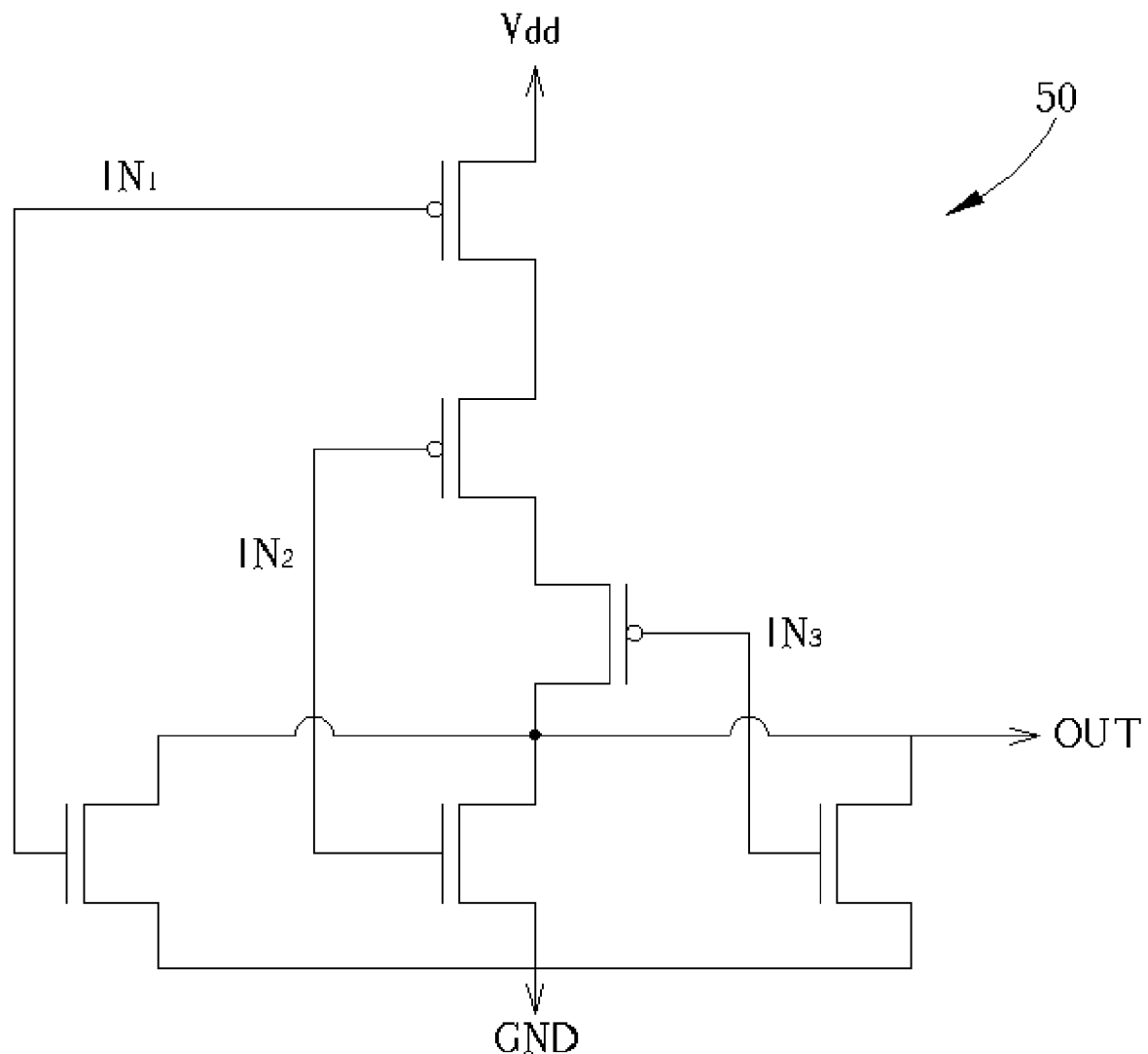
FIG. 8 is an equivalent circuit diagram of the NOR gate shown in FIG. 7.

Please refer to FIG. 7 in conjunction with FIG. 8. FIG. 7 is a diagram illustrating an NOR gate 50 established by the basic unit 42 according to the present invention, and FIG. 8 is an equivalent circuit diagram of the NOR gate 50 shown in FIG. 7. For programming the basic unit 42 to establish the NOR gate 50 shown in FIG. 7, at least a metal layer is utilized to implement required routing traces. Consequently, the programming node $N_1$ is electrically connected to a high voltage level ($V_{dd}$ for example), the programming node $N_8$ is electrically connected to a low voltage level (GND for example), the programming node $N_2$ is electrically connected to the programming node $N_9$, the programming node $N_4$ is electrically connected to the programming node $N_{11}$, the programming node $N_6$ is electrically connected to the programming node $N_{13}$, and the programming node $N_7$ is electrically connected to the programming nodes $N_{10}$, $N_{14}$. In addition, programming nodes $N_2$, $N_9$ correspond to an input port $IN_1$, programming nodes $N_4$, $N_{11}$ correspond to an input port $IN_2$, programming nodes $N_6$, $N_{13}$ correspond to an input port $IN_3$, and programming nodes $N_7$, $N_{10}$, $N_{14}$ correspond to an output port OUT.

Because all of the transistors 46a, 46b, 46c are NMOS transistors, the output port OUT is forced to correspond to the low voltage level (GND for example) when one of the input ports $IN_1$, $IN_2$, $IN_3$ is driven by the high voltage level to turn on a corresponding transistor 46a, 46b, 46c. However, the transistors 44a, 44b, 44c are PMOS transistors and cascaded in a series. Therefore, the output port OUT is allowed to have a voltage level equaling the high voltage level ($V_{dd}$ for example) only when all of the input ports $IN_1$, $IN_2$, $IN_3$ are driven by the low voltage level (GND for example). At this time, all of the transistors 44a, 44b, 44c are turned on, and the transistors 46a, 46b, 46c are switched off. An equivalent circuit standing for the NOR gate 50 is shown in FIG. 8. It is clear from the above description that the basic units 42 according to the present invention are capable of establishing any non-clocked logic circuits on the semiconductor body 42 with the help of the routing traces programmed by metal layers.

In the preferred embodiment, the basic unit 42 has 6 transistors 44a, 44b, 44c, 46a, 46b, 46c. As mentioned above, one basic unit 42 and appropriate routing traces are capable of building a circuit structure corresponding to the inverter 48a, 48b or the NOR gate 50. However, it is impossible to utilize just one basic unit and appropriate routing traces to establish all kinds of logic circuits. Therefore, the method according to the present invention makes use of a plurality of basic units and appropriate routing traces to build a complicated logic circuit such as a flip-flop.

Figure 9:
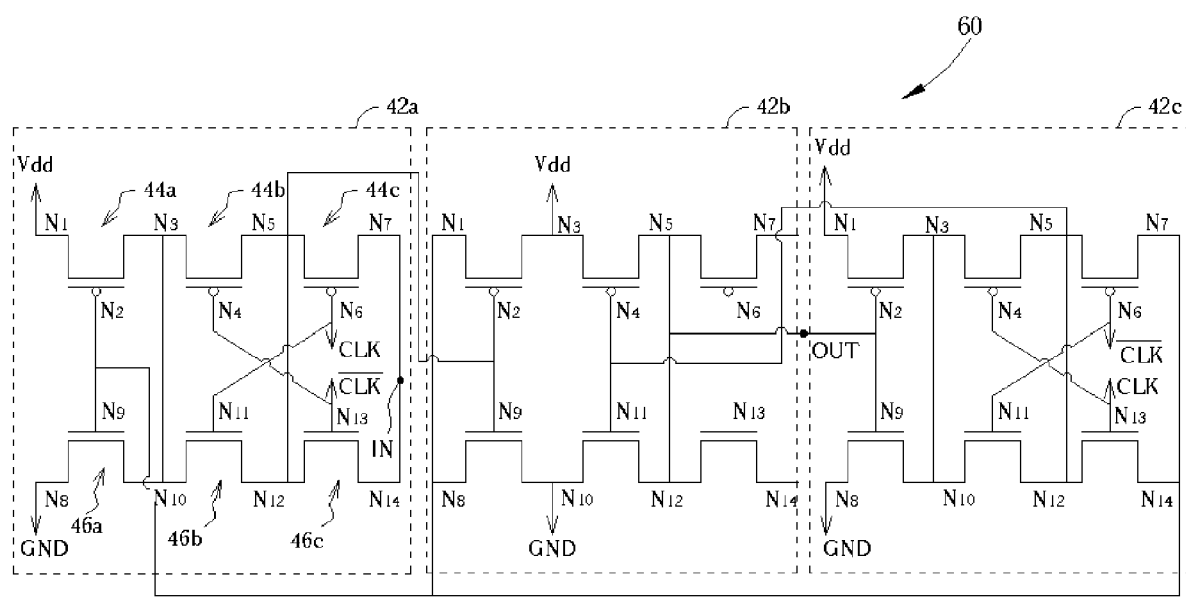
FIG. 9 is a diagram illustrating a flip-flop established by basic units according to the present invention.
Figure 10:
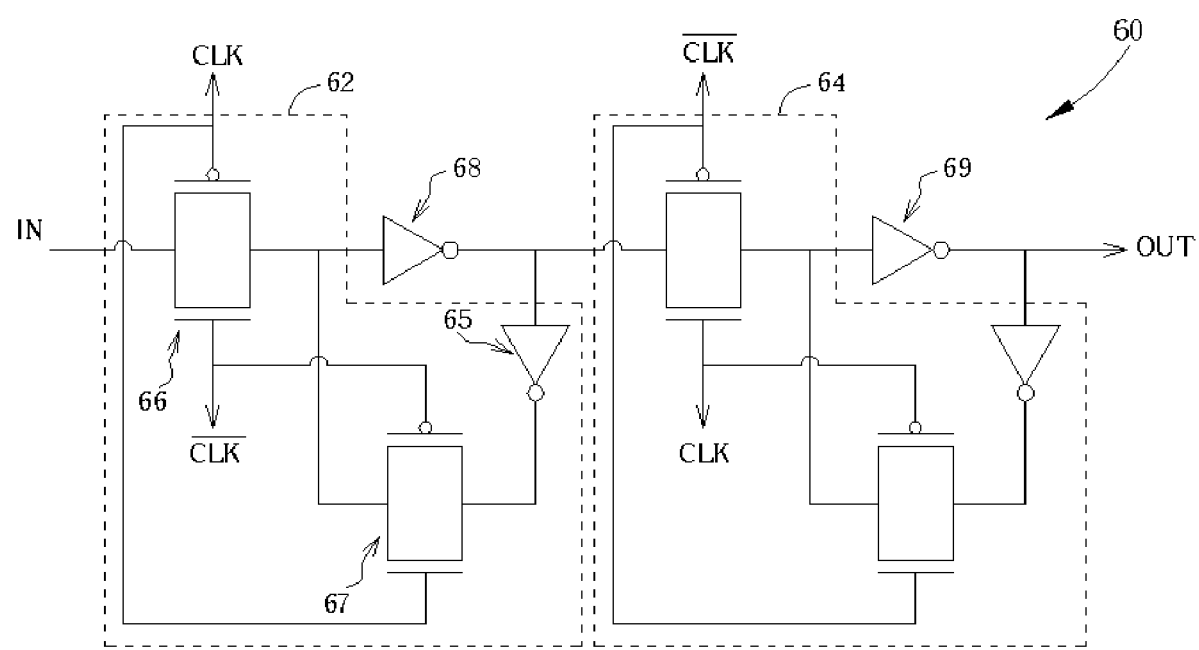
FIG. 10 is an equivalent circuit diagram of the flip-flop shown in FIG. 9.

Please refer to FIG. 9 in conjunction with FIG. 10. FIG. 9 is a diagram illustrating a flip-flop 60 established by basic units 42a, 42b, 42c according to the present invention, and FIG. 10 is an equivalent circuit diagram of the flip-flop 60 shown in FIG. 9. Concerning the basic unit 42a shown in FIG. 9, the programming node $N_1$ is electrically connected to a high voltage level ($V_{dd}$ for example), the programming node $N_8$ is electrically connected to a low voltage level (GND for example), the programming node $N_2$ is electrically connected to the programming node $N_9$, the programming node $N_4$ is electrically connected to the programming node $N_{13}$, the programming node $N_6$ is electrically connected to the programming node $N_{11}$, and the programming node $N_7$ is electrically connected to the programming node $N_{14}$ with the help of the traces routed on at least a metal layer.

With regard to another basic unit 42b, the programming node $N_1$ is electrically connected to the programming node $N_8$, the programming node $N_2$ is electrically connected to the programming node $N_9$, the programming node $N_3$ is electrically connected to a high voltage level ($V_{dd}$ for example), the programming node $N_{10}$ is electrically connected to a low voltage level (GND for example), the programming node $N_4$ is electrically connected to the programming node $N_{11}$, and the programming node $N_5$ is electrically connected to the programming node $N_{12}$ with the help of the traces routed on at least a metal layer.

Concerning the last basic unit 42c, the programming node $N_1$ is electrically connected to a high voltage level ($V_{dd}$ for example), the programming node $N_8$ is electrically connected to a low voltage level (GND for example), the programming node $N_2$ is electrically connected to the programming node $N_9$, the programming node $N_4$ is electrically connected to the programming node $N_{13}$, the programming node $N_6$ is electrically connected to the programming node $N_{11}$, and the programming node $N_7$ is electrically connected to the programming node $N_{14}$ with the help of the traces routed on at least a metal layer. In addition, basic units 42a, 42b, 42c are electrically connected through proper routing traces. That is, programming nodes $N_2$, $N_9$ of the basic unit 42a are electrically connected to programming nodes $N_1$, $N_8$ of the basic unit 42b and programming nodes $N_7$, $N_{14}$ of the basic unit 42c, programming nodes $N_5$, $N_{12}$ of the basic unit 42a are electrically connected to programming nodes $N_2$, $N_9$ of the basic unit 42b, programming nodes $N_4$, $N_{11}$ of the basic unit 42b are electrically connected to programming nodes $N_5$, $N_{12}$ of the basic unit 42c, and programming nodes $N_5$, $N_{12}$ of the basic unit 42b are electrically connected to programming nodes $N_2$, $N_9$ of the basic unit 42c.

In addition, a clock signal CLK is respectively inputted into the programming node $N_6$ of the basic unit 42a and the programming node $N_{13}$ of the basic unit 42c, and another clock signal $\overline{CLK}$, which is an inverted signal of the clock signal CLK, is inputted into the programming node $N_{13}$ of the basic unit 42a and the programming node $N_6$ of the basic unit 42c. The clock signal CLK and the clock signal $\overline{CLK}$ are used for controlling transistor switches formed by the NMOS transistors and PMOS transistors.

As shown in FIG. 9, the basic units 42a, 42c have similar routing designs. That is, the basic unit 42a is used to establish the circuit unit 62 shown in FIG. 10, and the basic unit 42c is used to establish the circuit unit 64 shown in FIG. 10. For the basic unit 42a, the programming nodes $N_7$, $N_{14}$ function as an input port IN of the flip-flop 60. With regard to the basic unit 42c, the programming nodes $N_2$, $N_4$ function as an output port OUT of the flip-flop 60. Taking the circuit structure corresponding to the basic unit 42a for example, it is obvious from the circuit structures of the inverters 48a, 48b shown in FIG. 5 that the transistors 44a, 46a are used to establish an inverter 65.

In addition, the gate (the programming node $N_{13}$) of the transistor 46c is connected to the gate (the programming node $N_4$) of the transistor 44b, and the gate (the programming node $N_6$) of the transistor 44c is connected to the gate (the programming node $N_{11}$) of the transistor 46b. The voltage level of the clock signal CLK, therefore, is used to turn on one of the transistor switch 66 formed by transistors 44c, 46c and the transistor switch 67 formed by the transistors 44b, 46b. That is, when the transistor switch 66 is turned on, the transistor switch 67 is turned off accordingly. On the other hand, when the transistor switch 67 is turned on, the transistor switch 66 is turned off accordingly. Similarly, it is known that basic unit 42b within the flip-flop 60 is used to establish the inverter 68 corresponding to the circuit unit 62 and the inverter 69 corresponding to the circuit unit 64 according to the circuit structures of the inverters 48a, 48b shown in FIG. 5. As mentioned above, the basic units 42 according to the present invention, therefore, are capable of establishing any clocked logic circuits on the semiconductor body 42 with the help of the routing traces programmed by metal layers.

Figure 11:
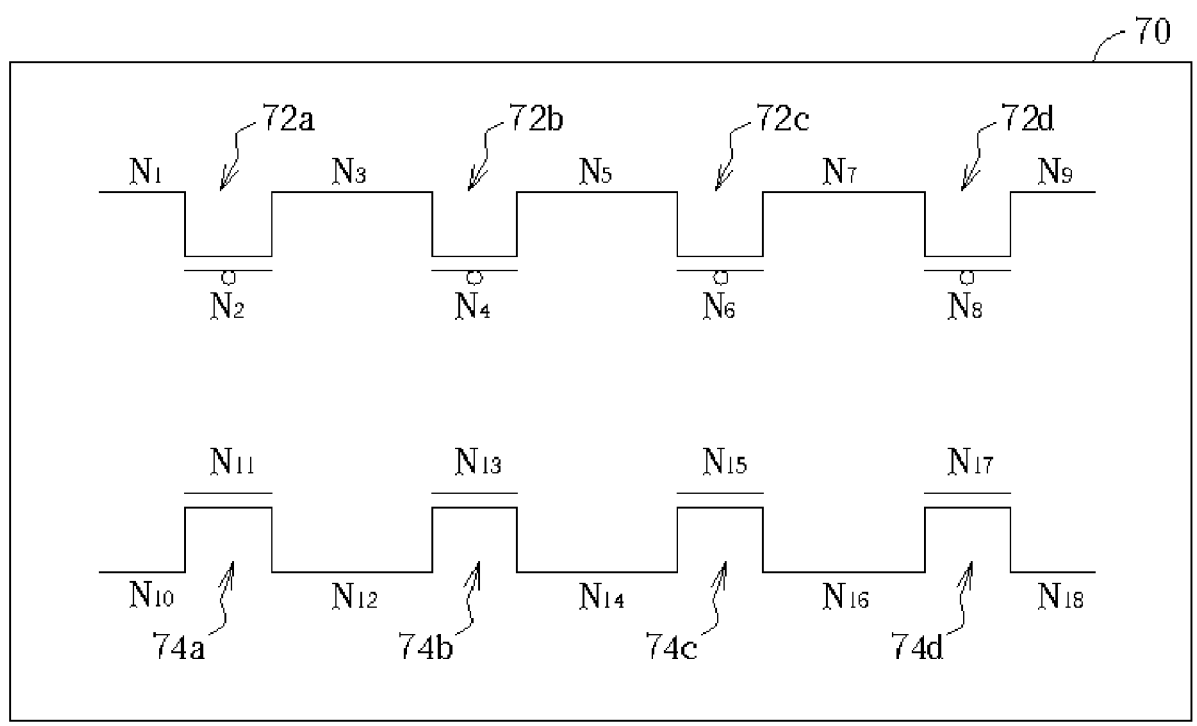
FIG. 11 is a diagram of another basic unit according to the present invention.
Figure 12:
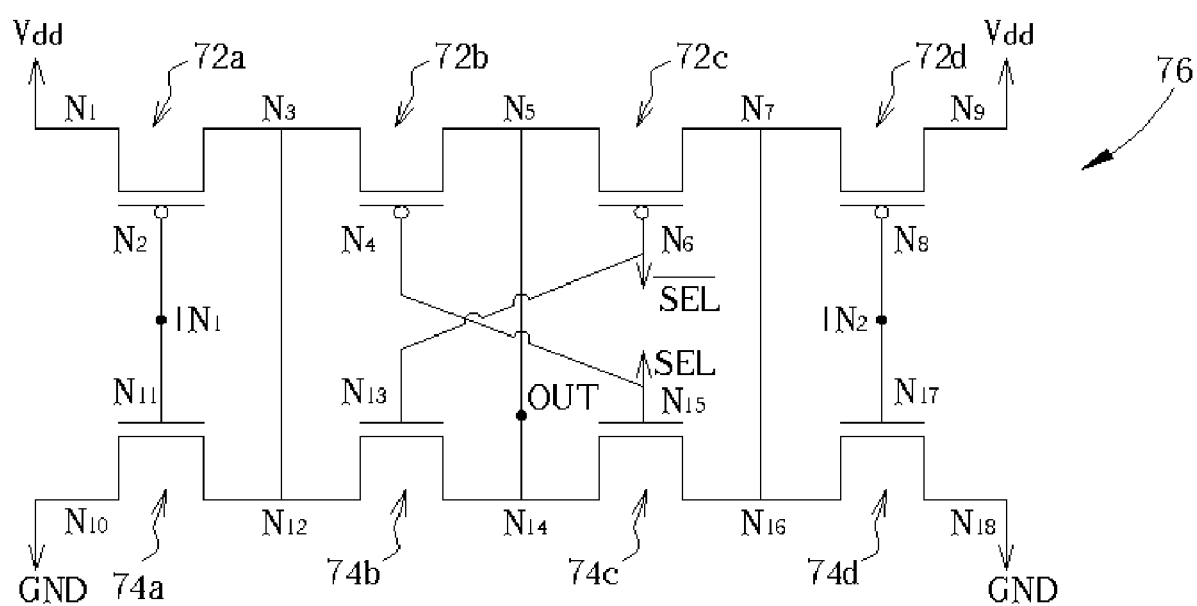
FIG. 12 is a diagram illustrating a multiplexer established by the basic unit shown in FIG. 11.
Figure 13:
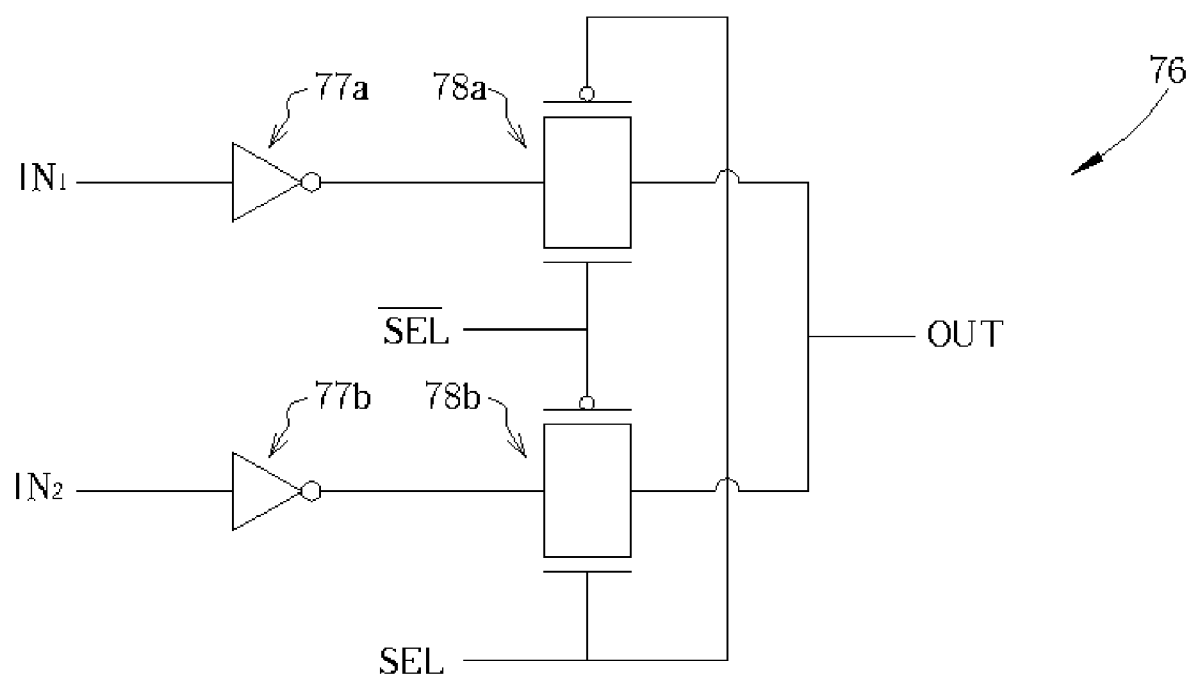
FIG. 13 is an equivalent circuit diagram of the multiplexer shown in FIG. 12.

Please note that the basic unit 42 as shown in FIG. 4 only has 6 transistors 44a, 44b, 44c, 46a, 46b, 46c. However, the basic unit 42 according to the present invention is not limited to a fixed amount of transistors. That is, the basic unit 42 is allowed to include a plurality of transistors. Therefore, a single basic unit 42 or a group of basic units 42 can be programmed to perform a predetermined logic operation through metal layers. Please refer to FIGS. 11, 12, and 13. FIG. 11 is a diagram of another basic unit 70 according to the present invention. FIG. 12 is a diagram illustrating a multiplexer 76 established by the basic unit 70 shown in FIG. 11. FIG. 13 is an equivalent circuit diagram of the multiplexer 76 shown in FIG. 12. The basic unit 70 has 8 transistors 72a, 72b, 72c, 72d, 74a, 74b, 74c, 74d, wherein transistors 72a, 72b, 72c, 72d are PMOS transistors, and transistors 74a, 74b, 74c, 74d are NMOS transistors. In addition, transistors 72a, 72b, 72c, 72d are cascaded in a series, and transistors 74a, 74b, 74c, 74d are cascaded in a series as well. As shown in FIG. 3, the basic units 70 and the basic units 42 are positioned according to the same rule mentioned before. In other words, the allocation of the basic units 70 is not divided into a synchronous region and a non-synchronous region, and the basic units 70 are programmed to establish either a clocked logic circuit or a non-clocked logic circuit with the help of the metal layers. Similarly, gates, sources, and drains of the transistors 72a, 72b, 72c, 72d, 74a, 74b, 74c, 74d correspond to a plurality of programming nodes $N_1$–$N_{18}$. Therefore, the traces routed among the programming nodes $N_1$–$N_8$ are controlled to achieve the objective of programming functionality of the basic unit 70.

Concerning the basic unit 70 shown in FIG. 12, the programming nodes $N_1$, $N_9$ are electrically connected to a high voltage level ($V_{dd}$ for example), programming nodes $N_{10}$, $N_{18}$ are electrically connected to a low voltage level (GND for example), the programming node $N_2$ is electrically connected to the programming node $N_{11}$, the programming node $N_3$ is electrically connected to the programming node $N_{12}$, the programming node $N_4$ is electrically connected to the programming node $N_{15}$, the programming node $N_6$ is electrically connected to the programming node $N_{13}$, the programming node $N_7$ is electrically connected to the programming node $N_{16}$, and the programming node $N_8$ is electrically connected to the programming node $N_{17}$. In addition, a selecting signal SEL is inputted into the programming node $N_{15}$, and another selecting signal $\overline{SEL}$, which is an inverted signal of the selecting signal SEL, is inputted to the programming node $N_6$. In the preferred embodiment, programming nodes $N_2$, $N_{11}$ function as an input port $IN_1$, programming nodes function as another input port $IN_2$, and programming nodes $N_5$, $N_{14}$ function as an output port OUT.

Transistors 72a, 74a are used to form the inverter 77a shown in FIG. 13, and the programming nodes $N_3$, $N_{12}$ correspond to an output port of the inverter 77a. Similarly, transistors 72d, 74d are used to form another inverter 77b shown in FIG. 13, and the programming nodes $N_7$, $N_{16}$ correspond to an output port of the inverter 77b. In addition, transistors 72b, 74b are used to establish the transistor switch 78a shown in FIG. 13, and transistors 72c, 74c are used to establish another transistor switch 78b shown in FIG. 13. Please note that the gate (the programming node $N_{15}$) of the transistor 74c is connected to the gate (the programming node $N_4$) of the transistor 72b, and the gate (the programming node $N_6$) of the transistor 72c is connected to the gate (the programming node $N_{13}$) of the transistor 74b. The selecting signal SEL, therefore, is capable of turning on one of the transistor switches 78a, 78b. That is, when the transistor switch 78a is turned on, the peer transistor switch 78b is turned off accordingly. Therefore, a signal inputted into the input port $IN_1$ is successfully outputted from the output port OUT. On the other hand, when the transistor switch 78b is turned on, the peer transistor switch 78a is turned off accordingly. Therefore, a signal inputted into the input port $IN_2$ is successfully outputted from the output port OUT. In other words, the multiplexer 76 functions as a 2:1 multiplexer.

The basic unit 70 includes 8 transistors, and it still can be programmed to establish a non-clocked logic circuit on the semiconductor body 40 through the traces routed on the metal layers. For the circuit structure shown in FIG. 9, it is easily implemented with 3 basic units 70. Therefore, the basic units 70 can be programmed to establish a clocked logic circuit on the semiconductor body 40 as well through the traces routed on the metal layers. To sum up, the present invention does not limit the number of transistors within a basic unit to a fixed value. That is, either a single basic unit or a group of basic units can be used to establish any clocked logic circuits or non-clocked logic circuits with the help of traces properly routed on the metal layers.

In contrast to the prior art, the method of fabricating an integrated circuit according to the present invention forms a plurality of basic units on a semiconductor body, wherein the allocation of basic units on the semiconductor body is not divided into a synchronous region and a non-synchronous region. Then, the method according to the present invention dynamically determines how many basic units are required to form clocked logic circuits and how many basic units are needed to form non-clocked logic circuits according to functionality of different integrated circuits. In other words, the method according to the present invention is capable of adjusting an amount of basic units corresponding to the clocked region and an amount of transistors corresponding to the non-clocked region. Therefore, the same semiconductor bodies are easily programmed by metal layers to produce different integrated circuits.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method of fabricating an integrated circuit, the integrated circuit having a semiconductor body, the method comprising following steps:
   (a) forming a plurality of basic units on the semiconductor body, each of the basic units having an identical structure; and
   (b) forming at least a layout layer to program the basic units for generating a clocked logic circuit and a non-clocked logic circuit without placing restrictions on positions of the clocked logic circuit and the non-clocked logic circuit on the semiconductor body;
   wherein the clocked logic circuit comprises at least two of the basic units of which at least one of the at least two basic units is programmed to be isolated from a clock feed.

2. The method of claim 1 wherein step (a) forms at least a transistor within each of the basic units.

3. The method of claim 2 wherein the transistor is an MOS transistor.

4. The method of claim 1 wherein step (b) utilizes the layout layer to program a plurality of basic units for generating the clocked logic circuit.

5. The method of claim 1 wherein step (b) utilizes the layout layer to program a basic unit for generating the non-clocked logic circuit.

6. The method of claim 1 wherein step (b) utilizes the layout layer to program a plurality of basic units for generating the non-clocked logic circuit.

7. The method of claim 1 wherein step (a) forms at least a PMOS transistor and at least an NMOS transistor within each of the basic units.

8. An integrated circuit comprising:
   a semiconductor body for positioning a plurality of basic units, each of the basic units having an identical structure;
   a clocked logic circuit formed on the semiconductor body, the clocked logic circuit being formed by at least one of the basic units; and
   a non-clocked logic circuit formed on the semiconductor body, the non-clocked logic circuit being formed by at least one of the basic units;
   wherein the clocked logic circuit comprises at least two of the basic units of which at least one of the at least two basic units is programmed to be isolated from a clock feed.

9. The integrated circuit of claim 8 wherein each of the basic units comprises at least a transistor.

10. The integrated circuit of claim 9 wherein the transistor is a MOS transistor.

11. The integrated circuit of claim 8 wherein each of the basic units comprises at lease a PMOS transistor and at least an NMOS transistor.

12. A method of fabricating an integrated circuit, the method comprising the following steps:
   forming a plurality of basic units on a semiconductor body, each of the basic units having a first row of transistors cascaded in a series and a second row of transistors cascaded in a series;
   forming at least a layout layer to program traces among the first row of transistors and the second row of transistors of at least a first basic unit; and
   forming a clocked logic circuit by at least two of the basic units of which at least one of the at least two basic units is programmed to be isolated from a clock feed.

13. The method of claim 12 wherein forming a clocked logic circuit comprises:
   programming at least one of the basic units to form a plurality of logic gates isolated from the clock feed; and
   programming at least one of the other basic units to receive the clock feed, such that at least one of the transistors in the basic unit is connected to the clock feed.

14. The method of claim 12 further comprising:
   while programming at least one of the basic units isolated from the clock feed, forming at least one logic signal input port by connecting gates of at least one transistor of the first row and at least one transistor of the second row, and forming at least one logic signal output port by connecting drains of at least one transistor of the first row and at least one transistor of the second row, and
   programming at least one of the other basic units to receive the clock feed by programming at least one transistor in the basic unit such that the at least one transistor have a gate connected to receive the clock gate, and a drain or a source connected to the logic signal input port or the logic output port.

15. An integrated circuit comprising:
   a semiconductor body for positioning a plurality of basic units, each of the basic units having a first row of first transistors cascaded in a series and a second of second transistors cascaded in a series;
   a layout layer comprising traces among the first row of transistors and the second row of transistors of at least one of the basic units; and
   a clocked logic circuit comprising at least two of the basic units of which at least one of the at least two basic units is programmed to be isolated from a clock feed by the layout layer.

16. The integrated circuit of claim 15 wherein the layout layer further comprises traces so that a gate of a first transistor of the first row of transistors is coupled to a gate of a first transistor of the second row of transistors, a gate of a second transistor of the first row of transistors is coupled to a gate of a third transistor of the second row of transistors, and a gate of a third transistor of the first row of transistors is coupled to a gate of a second transistor of the second row, a source of the first transistor of the first row of transistors is coupled to a high voltage source, a source of the first transistor of the second row of transistors is coupled to ground, a source of the second transistor of the first row of transistors is coupled to a source of the second transistor of the second row of transistors, a source of the third transistor of the first row of transistors is coupled to a source of the third transistor of the second row of transistors, a drain of the third transistor of the first row of transistors is coupled to a drain of the third transistor of the second row of transistors, the gate of the third transistor of the first row of transistors is coupled to a system clock, and the gate of the third transistor of the second row of transistors is coupled to an inversion of the system clock.

17. The integrated circuit of claim 15 wherein the first row of transistors of each basic unit is PMOS transistors, and the second row of transistors of each basic unit is NMOS transistors.

* * * * *

UNITED STATES PATENT AND TRADEMARK OFFICE
CERTIFICATE OF CORRECTION

| | | |
|---|---|---|
| PATENT NO. | : 7,185,307 B2 | Page 1 of 1 |
| APPLICATION NO. | : 10/708256 | |
| DATED | : February 27, 2007 | |
| INVENTOR(S) | : Hsin-Shih Wang | |

It is certified that error appears in the above-identified patent and that said Letters Patent is hereby corrected as shown below:

On the title page item (54), and col. 1, line 1, change

"METHOD OF FABRICATING AND INTEGRATED CIRCUIT THROUGH UTILIZING METAL LAYERS TO PROGRAM RANDOMLY POSITIONED BASIC UNITS"

to

--METHOD OF FABRICATING AN INTEGRATED CIRCUIT THROUGH UTILIZING METAL LAYERS TO PROGRAM RANDOMLY POSITIONED BASIC UNITS--

Signed and Sealed this

Eighth Day of May, 2007

JON W. DUDAS
*Director of the United States Patent and Trademark Office*